United States Patent
Merry, Jr. et al.

(10) Patent No.: US 7,653,778 B2
(45) Date of Patent: Jan. 26, 2010

(54) SYSTEMS AND METHODS FOR MEASURING THE USEFUL LIFE OF SOLID-STATE STORAGE DEVICES

(75) Inventors: David E. Merry, Jr., Bondsville, MA (US); Mark S. Diggs, Laguna Hills, CA (US); Gary A. Drossel, Laguna Niguel, CA (US)

(73) Assignee: Siliconsystems, Inc., Aliso Viejo, CA (US)

( * ) Notice: Subject to any disclaimer, the term of this patent is extended or adjusted under 35 U.S.C. 154(b) by 538 days.

(21) Appl. No.: 11/429,936

(22) Filed: May 8, 2006

(65) Prior Publication Data

US 2007/0260811 A1 Nov. 8, 2007

(51) Int. Cl.
*G06F 13/00* (2006.01)
(52) U.S. Cl. .............................. 711/103; 711/E12.008
(58) Field of Classification Search ................. 711/103, 711/E12.008
See application file for complete search history.

(56) References Cited

U.S. PATENT DOCUMENTS

| | | | |
|---|---|---|---|
| 5,442,768 A * | 8/1995 | Sudoh et al. ................. | 711/103 |
| 5,890,219 A | 3/1999 | Scaringella et al. | |
| 6,000,006 A | 12/1999 | Bruce et al. | |
| 6,269,434 B1 * | 7/2001 | Tanaka ....................... | 711/170 |
| 6,434,648 B1 | 8/2002 | Assour et al. | |
| 6,675,281 B1 | 1/2004 | Oh et al. | |
| 6,704,012 B1 * | 3/2004 | Lefave ....................... | 345/440 |
| 6,732,221 B2 | 5/2004 | Ban | |
| 6,754,765 B1 | 6/2004 | Chang et al. | |
| 6,944,063 B2 * | 9/2005 | Chen et al. ............. | 365/185.33 |
| 7,079,395 B2 | 7/2006 | Garnett et al. | |
| 7,277,978 B2 | 10/2007 | Khatami et al. | |
| 2002/0138602 A1 * | 9/2002 | Vinberg ....................... | 709/223 |
| 2004/0228197 A1 | 11/2004 | Mokhlesi et al. | |
| 2005/0281112 A1 | 12/2005 | Ito et al. | |
| 2006/0085670 A1 | 4/2006 | Carver et al. | |
| 2006/0085836 A1 | 4/2006 | Lyons, Jr. et al. | |
| 2006/0095647 A1 | 5/2006 | Battaglia et al. | |
| 2006/0282709 A1 | 12/2006 | Shu et al. | |
| 2007/0008186 A1 | 1/2007 | Michaels et al. | |
| 2007/0053513 A1 | 3/2007 | Hoffberg | |

(Continued)

OTHER PUBLICATIONS

Webpage printed out from <http://www.m-systems.com/site/en-US/Support/DeveloperZone/Software/LifespanCalc.htm> on Jun. 13, 2006.

(Continued)

*Primary Examiner*—Matt Kim
*Assistant Examiner*—John P Fishburn
(74) *Attorney, Agent, or Firm*—Knobbe Martens Olson & Bear, LLP

(57) ABSTRACT

A non-volatile solid-state storage subsystem, such as a non-volatile memory device, maintains usage statistics reflective of the wear state, and thus the remaining useful life, of the subsystem's memory array. A host system reads the usage statistics information, or data derived therefrom, from the subsystem to evaluate the subsystem's remaining life expectancy. The host system may use this information for various purposes, such as to (a) display or report information regarding the remaining life of the subsystem; (b) adjust the frequency with which data is written to the subsystem; and/or (c) select the type(s) of data written to the subsystem.

21 Claims, 6 Drawing Sheets

U.S. PATENT DOCUMENTS

| | | | |
|---|---|---|---|
| 2007/0073944 A1 | 3/2007 | Gormley | |
| 2007/0180328 A1* | 8/2007 | Cornwell et al. | 714/42 |
| 2007/0260811 A1 | 11/2007 | Merry, Jr. et al. | |
| 2007/0268791 A1 | 11/2007 | Grow et al. | |

OTHER PUBLICATIONS

Webpage printed out from <http://www.m-systems.com/site/en-US/Technologies/Technology/TrueFFS$_{13}$ Technology.htm> on Jun. 13, 2006.

Webpage printed out from <http://www.techworld.com/storage/features/index.cfm?FeatureID=498> on Jun. 13, 2006.

International Search Report and Written Opinion in PCT Application No. PCT/US2007/68490; Dated Sep. 29, 2008 in 11 pages.

Document explaining prior sale.

Silicondrive User's Guide, SiSMART Function, Preliminary Version 2.2 Revision A, Feb. 2005.

International Search Report and Written Opinion for International Application No. PCT/US09/32984, mailed on Mar. 17, 2009, in 10 pages.

International Search Report and Written Opinion for International Application No. PCT/US09/33262, mailed on Mar. 25, 2009, in 10 pages.

* cited by examiner

SYSTEMS AND METHODS FOR MEASURING THE USEFUL LIFE OF SOLID-STATE STORAGE DEVICES

BACKGROUND OF THE INVENTION

1. Field of the Invention

The present invention relates to solid-state storage devices. More specifically, the present invention relates to systems and methods for measuring and monitoring the useful life of solid-state storage devices in operating environments.

2. Description of the Related Art

Rotating hard disk drives (HDD) used, for example, in desktop, laptop, notebook, sub-notebook, tablet and embedded computers support an industry-standard advanced technology attachment (ATA) command called Self Monitoring and Reporting Technology (SMART). The SMART function was designed to act as an "early warning system" for pending problems with mechanical media such as HDDs. The integrated controller on the HDD works in conjunction with various sensors to monitor a variety of different parameters within the HDD, such as mechanical wear of the HDD's spindle motor, to determine if any of the parameters are drifting from a norm that would indicate a possible problem with the HDD.

By contrast with HDDs, solid-state storage subsystems generally do not have moving parts. Thus, many of the parameters monitored by the SMART function used in HDDs are not applicable to solid-state storage subsystems. Solid-state storage subsystems generally include non-volatile storage components that can lose the ability to retain data stored thereon after approximately hundreds of thousands to approximately millions of write/erase cycles.

Generally, non-volatile storage components used in solid-state storage subsystems have a finite number of program/erase cycles (usually specified by component vendors as "endurance") that are recommended or guaranteed for proper data storage and retrieval. The number of such cycles varies by orders of magnitude based on the type of storage component used. Unfortunately, however, there is currently no method that can reliably determine or predict when the recommended or guaranteed endurance in a particular non-volatile storage component will be exceeded. Thus, solid-state storage subsystems are often allowed to operate beyond the specified endurance until a failure occurs, causing unscheduled system down time and potentially significant data loss.

SUMMARY OF THE INVENTION

Thus, it would be advantageous to develop a technique and system for reporting information from a solid-state storage subsystem to a host system that uses the information to measure or determine the useful life remaining in the non-volatile storage components of the solid-state storage subsystem.

The present invention comprises a non-volatile solid-state storage subsystem designed to internally maintain usage statistics information reflective of the wear state, and thus the remaining useful life, of the subsystem's memory array. The storage subsystem may, for example, be in the form of a detachable or removable device that plugs into, and receives power and commands via, a standard slot or port of a host computer system. In one embodiment, the storage subsystem supports one or more commands for enabling the host system to read the usage statistics information, or data derived therefrom, to evaluate the subsystem's remaining life expectancy. The host system may use this information for various purposes, such as to display or report information to a user regarding the remaining life of the subsystem, and/or to vary a subsystem usage policy (e.g., to avoid storing mission critical data on a device that is near the end of its useful life).

Neither this summary nor the following detailed description purports to define the invention. The invention is defined by the claims.

BRIEF DESCRIPTION OF THE DRAWINGS

A preferred embodiment of the invention will now be described with reference to the drawings summarized below, which are intended to illustrate, and not limit the present invention.

DETAILED DESCRIPTION OF PREFERRED EMBODIMENT

A solid-state storage subsystem, and associated processes that may be implemented by a host computer, will now be described with reference to the drawings. This description is intended to illustrate a preferred embodiment of the invention, and not limit the invention. The invention is defined by the claims.

I. Overview

Figure 1:
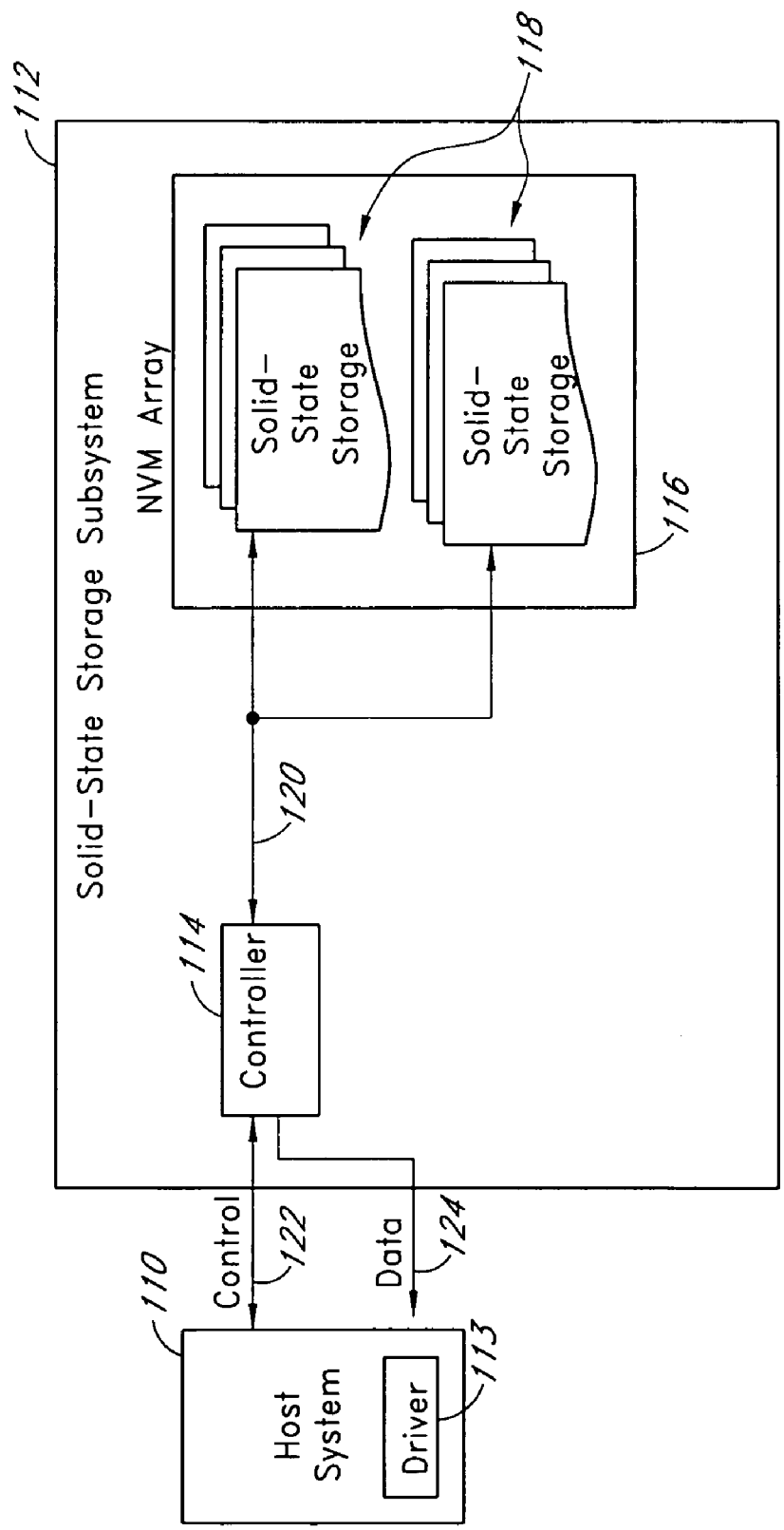
FIG. 1 is a is a block diagram illustrating a host system linked to a solid-state storage subsystem according to one embodiment of the invention.

FIG. 1 is a block diagram illustrating a host system 110 connected to a solid-state storage subsystem 112 according to one embodiment of the invention. The host system 110 comprises a computer such as a personal computer, workstation, router, blade server or other type of computing device. For example, the host system 110 may be a military system, a flight computer or other flight avionics system, a wearable computer used for military applications, a high-speed data recorder, a medical device, an industrial control system, an interactive kiosk, a personal digital assistant, a laptop computer, an interactive wireless communication device, a point-of-sale device, or the like. The host system 110 stores data on the solid-state storage subsystem 112, and may provide operating system functionality and a boot process for the subsystem 112. The host system 110 executes a driver program 113 that provides functionality for communicating with the subsystem 112, such as by issuing commands in accordance with an ATA or other standard.

The solid-state storage subsystem 112 comprises a controller 114 and a non-volatile memory (NVM) array 116. The NVM array may, but need not, be implemented using NAND memory components. As is conventional, the controller 114 is configured (typically via firmware) to write data to, and read data from, the NVM array in response to commands from the host 110. The controller also preferably implements a wear-leveling algorithm, as is known in the art, to distribute write operates across memory blocks of the NVM array. The storage subsystem 112 may be in the form of a detachable device and may communicate with any standard or unique communications interface, including but not limited to parallel, serial ATA, IEEE, RS232/423, PCMCIA, USB, Firewire (IEEE-1394), FibreChannel, or PCI Express bus. The storage subsystem 112 may also receive its power from the host over this bus.

As discussed in detail below, as the controller 114 performs write operations to the memory array 114, it updates a non-user-data area of the array (i.e., an area not exposed to the host's operating system) with usage statistics information reflective of the number of program/erase cycles that have been executed. This information preferably includes a set of counters, with different counters corresponding to different blocks or areas of the memory array; however, the usage statistics may be maintained in any of a variety of formats. These counters are initially set to zero (or some other selected starting value) when the device is manufactured or first initialized, and are incremented over time as program/erase cycles are performed. In some embodiments, the usage statistics data stored in the memory subsystem 112 also includes timestamps, or other temporal data, received from the host; this temporal data may be used to calculate the useful life of the subsystem 112 in terms of time (e.g., days and hours), as may be desirable for some applications.

In addition to industry standard commands, the controller 114 supports, and the driver 113 issues, one or more vendor-specific commands that provide host access to some or all of the usage statistics information. The controller 114 may provide the usage statistics data to the host in its raw format, and/or in a summarized or aggregated form. The host system 114 may use the retrieved usage statistics in a variety of ways so as to reduce the likelihood of data loss. For example, the host system, via the driver 113 or another software component, may display information, such as a gauge (see FIGS. 2A and 2B, discussed below), reflective of the remaining life of the subsystem 112. The host system may also trigger an alert message to indicate that preventive maintenance will be required at a certain time in the future.

Users may use the reported information in a variety of ways. For example, based on historical usage and the predicted amount of useful life remaining, a user may decide to replace the storage subsystem 112 during a regularly scheduled maintenance of the host system. As another example, the resale value of the host system 110 and/or the solid-state storage 112 system may be based at least in part on the useful life remaining in the solid-state storage subsystem.

As another example of how the retrieved usage data may be used, the host system 110 may be programmed to use the usage data to adjust its use of the subsystem 112. For instance, as discussed in further detail below, in a host system that periodically logs data to the solid-state storage subsystem 112, the host 110 may reduce the frequency with which it logs such data as the subsystem approaches the end of its useful life. The host system may also vary its usage policy so that mission critical data is only stored on a subsystem that has not yet reached a particular wear threshold, such as 75%.

Thus, the user and/or the host system 110 can reduce or eliminate the cause of solid-state storage subsystem endurance-related failures. In one embodiment, for example, the host system or user can set a wear threshold that, when met, indicates that the solid-state storage subsystem is in need of preventative maintenance and/or replacement. In addition, or in other embodiments, the host 110 can use data from two time periods and their respective timestamps to calculate the remaining lifespan of the storage subsystem 112. For example, as discussed below, the driver 113 may be configured to periodically write a timestamp to the subsystem 112 (or another storage device) together with information about the subsystem's current wear level, data usage information or endurance data collection, and to retrieve and analyze this information to predict the amount of time before the subsystem fails.

The storage subsystem 112 may, for example, be a solid-state memory card that plugs into a slot of the host system 110 and complies with at least one of the following card specifications: CompactFlash, PCMCIA, SmartMedia, MultiMediaCard, SecureDigital, Memory Stick, ATA/ATAPI. The storage subsystem 112 may, for example, have a housing and signal interface that complies with one of the following specifications: sub 1 inch hard disk drive, 1.8 inch hard disk drive, 2.5 inch hard disk drive and 3.5 inch hard disk drive. A custom form factor and/or signal interface may alternatively be used.

In one embodiment, the controller 114 executes a firmware program to perform processes as described herein and comprises an ATA flash disk controller available from Silicon Storage Technology, Inc. of Sunnyvale Calif. as part number SST55LD019A. The controller 114 may alternatively be implemented using another type of device, such as an application-specific integrated circuit (ASIC), or may comprise multiple distinct devices. Further, although the controller 114 preferably executes firmware, a controller that does not execute a firmware program may be used.

The NVM array 116 comprises a plurality of solid-state storage devices 118 coupled to the controller 114. The solid-state storage devices 118 may comprise, for example, flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM chips. The solid-state storage devices 118 may be physically divided into blocks, pages and sectors, as is known in the art.

The host system 110 exchanges control signals 122 with the controller 114 to coordinate the reading and writing of data to and from the solid-state storage devices 118. The controller 114 handles the read and write operations by sending memory control signals 120 to the NVM array 116. The control signals 122 may include, for example, read commands and write commands. The control signals 122 may be used to send commands selected from, for example, industry standard command sets such as those provided by ATA, CF card or PC card standards to read from or write data to standard storage devices. The host system 110 also exchanges data signals 124 with the controller 114. The data signals may include, for example, data to be written to the NVM array 116, data read from the NVM array, and monitored data, as discussed below.

To retrieve some or all of the stored usage statistics data, the host system 110, via the driver 113, sends a defined sequence of vendor-specific commands to the controller 114. In some cases, the host system 110 may transmit this data, or information derived therefrom, over a computer network to another node.

II. Example User Interface

Figure 2A:
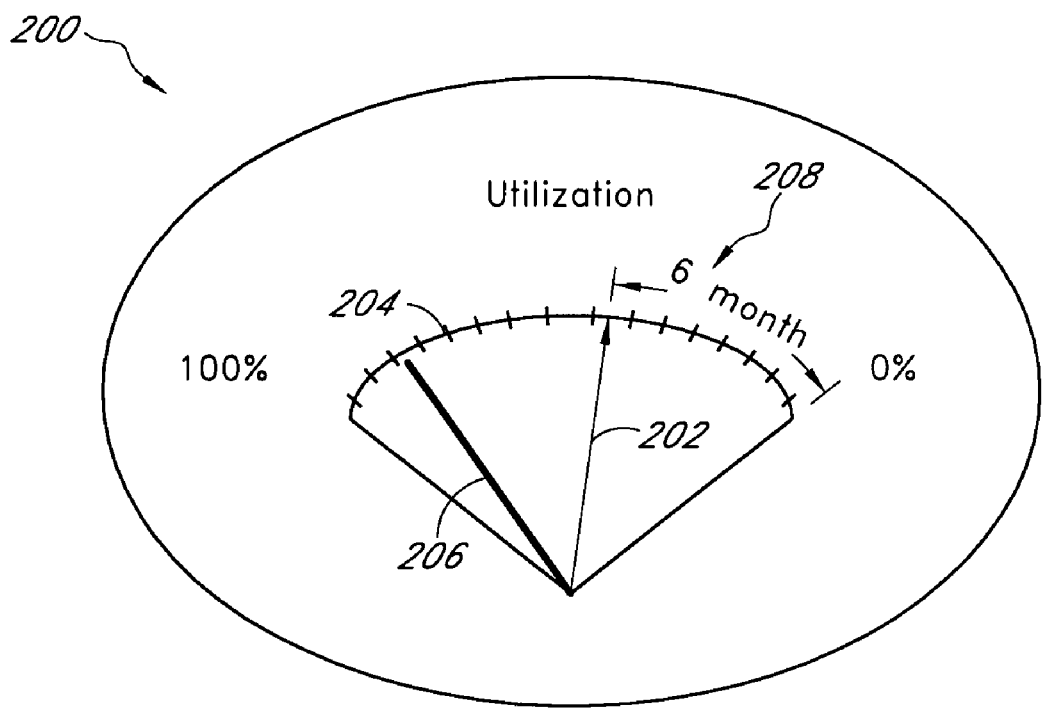
FIGS. 2A and 2B illustrate examples of meter displays that may be generated by the host system to indicate the amount of useful life remaining in the solid-state storage subsystem.

FIG. 2A illustrates one example of a meter or gauge 200 that may be generated by the driver 113, or another software component, to indicate the amount of useful life remaining in the solid-state storage subsystem 112. In this example, a pointer 202 in the meter display 200 indicates the wear state or "utilization" of the NVM array 116 relative to a percentage scale 204. If the pointer 202 points to 0%, for example, substantially all of the specified endurance or number of program/erase cycles recommended or guaranteed for the NVM array 116 remain. If, however, the pointer 202 points to 100%, the specified endurance of the NVM array 116 has been reached and the probability of a failure is very high.

As shown in FIG. 2A, the meter display 200 in this example also includes a threshold indicator 206 displayed relative to the percentage scale 204 so as to indicate an upper limit or threshold set by the host system 110 or a user. The threshold is advantageously set below a specified data endurance or wear level so as to reduce the probability of a failure. In one embodiment, a warning signal is provided once the pointer 202 reaches the threshold indicator 206. The driver 113 may prevent the host system 110 from performing additional write operations to the subsystem 112 once this or some other threshold has been reached.

In the example shown in FIG. 2A, the time indicator 208 is a sliding time window of six months starting from a current time corresponding to a current location of the pointer 202 and extending back in time for six months. Thus, by observing the percentage of available program/erase cycles used during the past six months, for example, the host system 110 or user can predict when the pointer 202 will reach the threshold indicator 206 and/or the specified endurance limit (e.g., 100%) and display or otherwise output this prediction to a user. Various other types of time indicators can be used. For example, in another embodiment, the time indicator 208 starts at 0% and ends at the pointer 202 while incrementing the displayed time (e.g., 1 day, 2 weeks, 4 months, etc.).

Figure 2B:

Other types of displays may also be used, such as the status bar shown in FIG. 2B. The status bar 220 grows as the percentage of specified endurance for the NVM array 116 is used. As shown in FIG. 2B, in certain such embodiments, the status bar 220 includes a displayed percentage 222 of specified endurance used. In other embodiments, the percentage is displayed as a scale along the length of the status bar 220.

In some embodiments, the storage subsystem 112 may itself be configured to display information about its current wear state. For example, the storage subsystem may include a small LCD or other display that generates a gauge image similar to that shown in FIG. 2B, or which displays a value or symbol reflective of the wear level, data endurance or life expectancy of the device. In such embodiments, the ability for the host 110 to read the stored usage data may optionally be omitted.

III. Calculation of Remaining Useful Life

Figure 3:
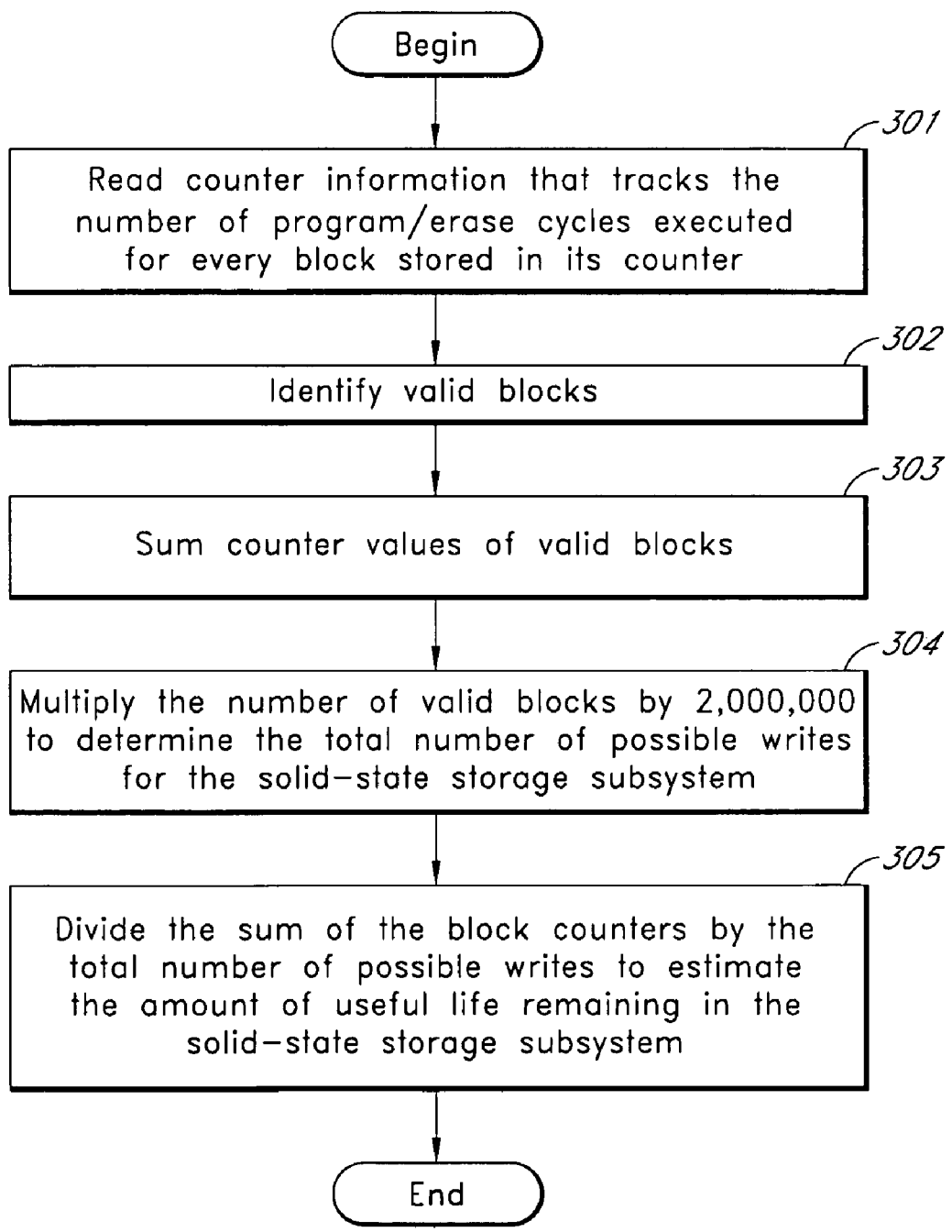
FIG. 3 illustrates a process that may be used to calculate the amount of useful life remaining in the solid-state storage subsystem.

FIG. 3 illustrates a sample process for determining the wear level of a solid-state storage subsystem 112 according to one embodiment. The illustrated steps may be performed solely by the controller 114 in response a command or command sequence from the host, or may be performed partially by the controller 114 and partially by the driver/host. In step 301, the controller 114 reads the block counters for each of the 128 k memory blocks in the memory array 116. Each such counter value indicates the number of program/erase cycles experienced by the respective block. As discussed below in connection with FIG. 4, the block counters 408 may be maintained in non-user-data areas of their respective blocks 402. Next, in step 302 the valid blocks are identified. In certain embodiments, a valid block is identified by the controller 114 by determining which blocks are invalid. During a write or erase procedure the controller 114 may attempt to write or erase a page or a block; if an error is returned to the controller 114, the controller 114 will try a second attempt. If the second attempt also fails to return the proper data or error correction code (ECC) 420, then the block will be marked as an invalid block.

In step 303, the counter values of the valid blocks are summed. The number of valid blocks is also multiplied by 2,000,000 in step 304 to determine the total number of possible writes for the solid-state storage subsystem 112. The 2,000,000 value reflects the number of erase cycles specified as the endurance of most solid-state storage device 118, any may be varied significantly to accommodate different types of memory devices. In other embodiments, the value may be set below this common value so as to reduce the risk of losing data due to a failure. For example, in some embodiments, the threshold is set in a range between approximately 70% and approximately 90% of the specified endurance of the solid-state storage. Finally, in step 305, the sum of the block counters from step 303 is divided by the total number of possible writes from step 304 to estimate the amount of useful life remaining in the storage subsystem 112 as a percentage.

The ATA interface allows vendors to create vendor-specific commands in order to properly engage with the hardware the vendor manufactures for an ATA interface. In certain embodiments discussed herein, in addition to industry standard commands, the controller 114 supports, and the driver 113 issues, one or more vendor-specific commands that provide host access to some or all of the usage statistics information, such as reading counter information for data blocks. Furthermore, one or more vendor-specific commands may provide the host access to information regarding the number of invalid blocks.

IV. Organization of Memory Array

Figure 4:
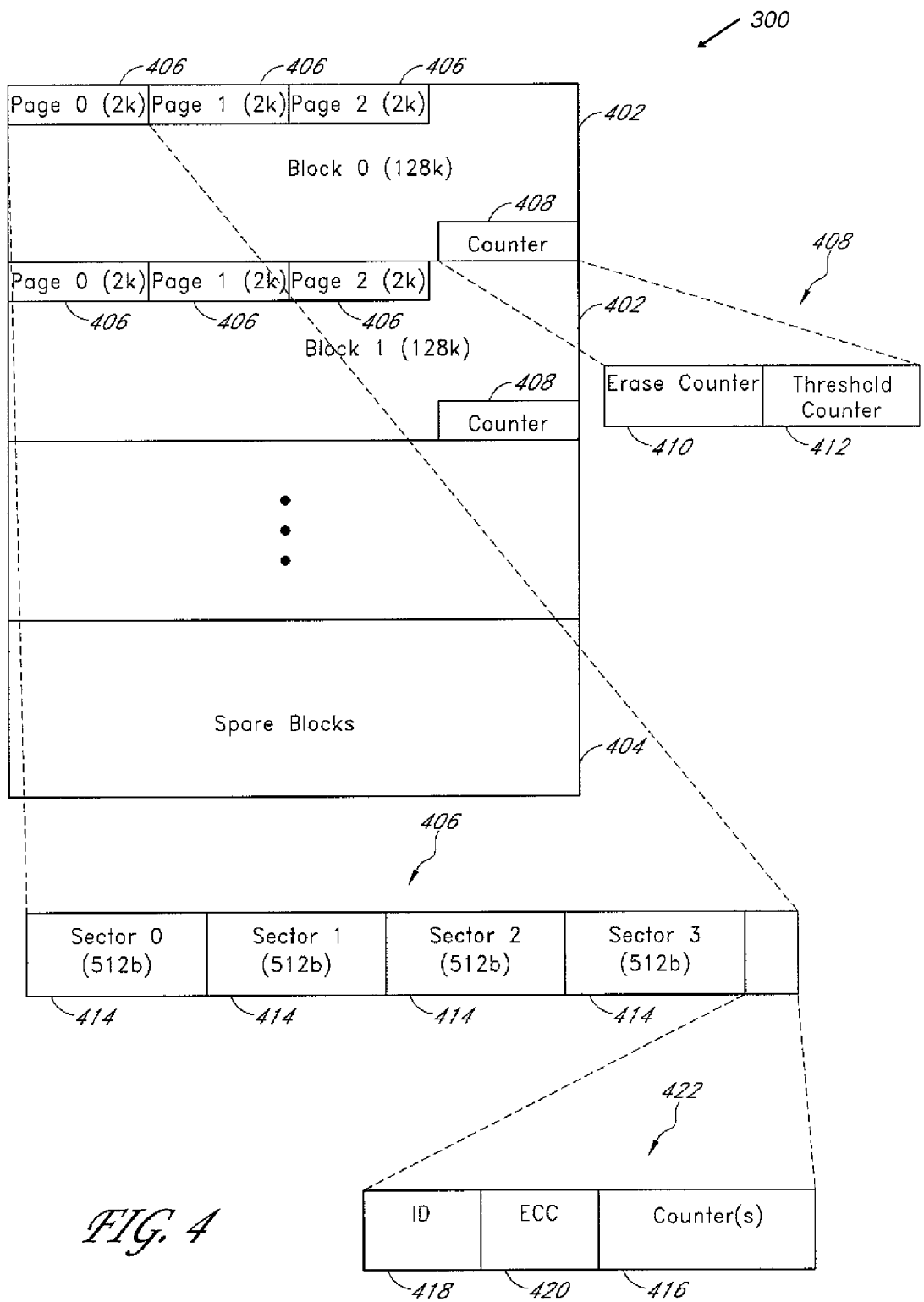
FIG. 4 illustrates one example of how the non-volatile memory of the storage subsystem may be arranged.

FIG. 4 illustrates the physical data structure 300 of a solid-state storage device 118 according to one embodiment. As will be recognized, the arrangement of data elements in FIG. 4 represents only one of many possible arrangements that can be used to practice the invention. The data structure 300 is divided into a plurality of data blocks 402 (Block 0 and Block 1 are shown) and spare data blocks 404. The data blocks 402 are further divided into a plurality of pages 406. Pages are further divided into a plurality of sectors 414.

In the example shown in FIG. 4, the data blocks 402 are 128-kBytes, the pages 406 are 2-kBytes and the sectors are 512-Bytes. The data blocks 402, pages 406 and sectors 414 can, of course, have other sizes. An artisan will also recognize that individual bytes typically are not be written or programmed into a sector 414 of a solid-state storage device 118. Rather, entire sectors 414 or pages 406 are generally programmed at the same time. Further, the sectors 414 or pages 406 are cleared of any previous data before being programmed with any new data. Generally, an entire data block 402 is erased at the same time.

One data storage method is to map logical addresses to fixed physical locations on the solid-state storage devices 118. However, when a host application updates the same data repeatedly, direct mapping can quickly cause one or more data blocks 402 to wear out due to the large number of program/erase cycles. Repeatedly updating the same group of sectors is common. For example, file systems generally maintain data that describes the allocation of sectors 414 to files. Such data is generally located in a predetermined area on a solid-state storage device 118.

Figure 5:
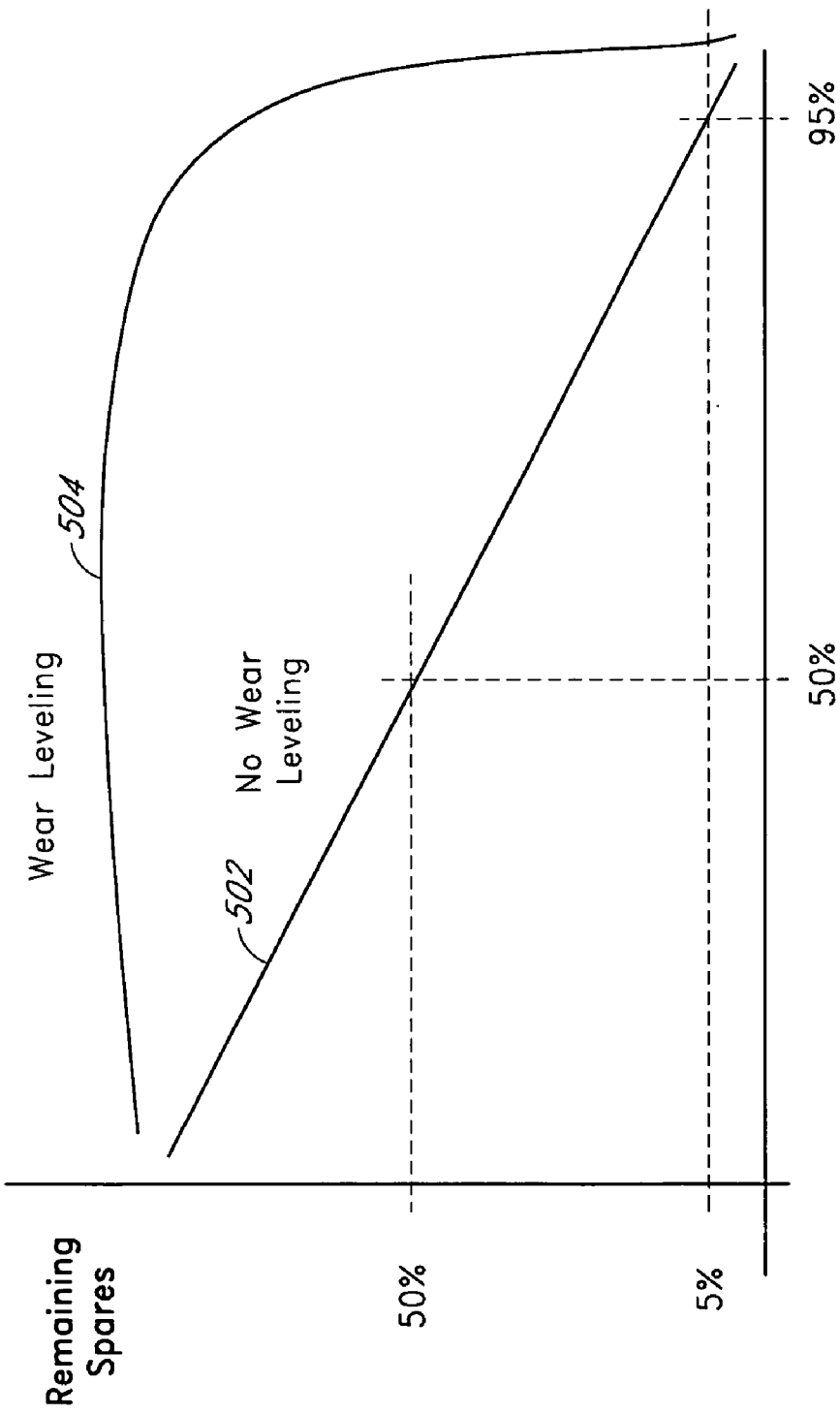
FIG. 5 is a graph illustrating the relationship between the life used of a solid-state storage device and the spare data blocks remaining in the solid-state storage device.

To prevent failures due to repeated program/erase cycles in high-volume locations, the controller 114 remaps logical data to spare data blocks 404 when a particular data block 402 reaches its limit of specified endurance. When using spare data blocks 404 for this purpose, the remaining useful life of the NVM array 116 is directly related to the number of spare data blocks 404 remaining. For example, FIG. 5 is a graph illustrating the relationship between the life used of a solid-state storage device 118 and the spare data blocks 404 remaining in the solid-state storage device 118. The line 502 illustrates that the useful life of the solid-state storage device 118 can be measured by the number of remaining spare data blocks 404. For example, when 50% of the spare data blocks 404 have been used, 50% of the solid-state storage device's 118 life has been used.

However, the common use of wear leveling makes it more difficult to predict the amount of life remaining in a solid-state storage device 118. Wear leveling is generally used to map the same logical data to different physical locations. Thus, program/erase cycles can be evenly spaced across the NVM array 116. Wear leveling may include, for example, monitoring the number of program/erase cycles for the data blocks 402 and changing the logical-to-physical address mapping of one or more data blocks 402 so as to direct future high-volume re-writes to data blocks 402 that have historically been used less often. Thus, the spare data blocks 404 are not generally used until the program/erase cycles have been spread across the data blocks 402 such that a large number of the data blocks 402 have reached their specified endurance limit. When the number of spare data blocks 404 falls below a selected threshold, the controller 114 may, in some embodiments, be configured to interrupt and send a notification message to the host system 110.

Referring again to FIG. 5, when using wear leveling, the line 504 illustrates that monitoring the number of spare data blocks 404 remaining is not a good predictor of the percentage of life used because spare data blocks 404 do not begin to be used until a large number of data blocks have reached their specified endurance limit. Thus, the number of spare data blocks 404 declines rapidly toward the end of the useful life of the solid-state storage device 118. Therefore, adequate warning of the end of the useful life typically cannot generally be provided by monitoring the number of spare data blocks 404 remaining.

In the illustrated embodiment, a predetermined page in a data block 402 is designated as a block counter 408 used by the controller 114 to store monitored data. In certain embodiments discussed herein, the block counter 408 may store the number of times substantially the data block was erase. The block counter 408 may also store the number of times substantially all the data blocks 402 in the NVM array 116 are erased, the number of times substantially all the data blocks 402 in a corresponding solid-state storage device 118 are erased, the number of data blocks 402 that are at or near a threshold value, the number of spare data blocks 404 used, combinations of the foregoing, or the like. In certain embodiments, the block counter 408 may be kept in any storage area generally not accessible by an end user using logical block addressing access.

In order to implement wear-leveling, data is written to pages 406 in a first block 300 until all available pages in the first block 300 store data. As each page 406 is written, its write counter 416 is incremented. When the first block 300 is full, the data is moved to a second block, the first block 300 is erased, and the first block's threshold counter 412 is incremented. After a threshold value is met, the erase counter 410 is incremented and the threshold counter 412 is reset. The combination of the erase counter 410 and the threshold counter 412 make up the total number value for the block counter 408.

Although the usage data is maintained in the NVM array 116 in the preferred embodiment, the controller 114 could alternatively store this data is a separate non-volatile memory. For example, the controller 114 could include its own internal non-volatile memory that is used for this purpose, or could access a separate NVM array that is used to store such status information.

In one embodiment, the controller 114 outputs the raw conductor data to the host system 110, and the driver 113 analyzes this data to determine, for example, the amount of life left in the NVM array 116 and/or individual solid-state storage devices 118. The driver 113 may also predict, for example, when the NVM array 116 will likely reach its overall specified endurance. As mentioned above, the controller 114 may alternatively perform some or all of the analysis of the counter data, and output the result to the host 110.

In certain embodiments, usage is also tracked at the page 406 and/or sector 414 levels. Returning to FIG. 4, the magnified data sector 422 illustrates a data structure including one or more counters 416 for maintaining data used to measure the remaining life of the NVM array 116 and/or the corresponding solid-state storage device 118. The sector 422 also includes an identification (ID) 418 representing a physical address of the sector 422 and ECC 420 including data for detecting and correcting errors in user data sectors 414. In certain embodiments, as shown, the data structure 422 housing the counter 416, ID 418, and ECC 420 is composed of four 16-Bytes which are usually not accessible in the readable-writeable area of the NVM.

The one or more counters 416 include, for example, a revision counter representing the number of times the controller 114 has written to the particular sector 414 and an erase counter representing the number of times the controller 114 has erased the corresponding data block 402. In addition, or in other embodiments, the counters 416 include a pointer to the location of the counter 408 in the data block 402. The controller 114 accesses monitored data from one or more of the counters 408, 416 in response to a command from the host system 110. The host system 110 may request the monitored data at any time, as part of a background process, and/or on a polling schedule (e.g., hourly, daily, and/or monthly). In certain embodiments, the controller 114 accesses monitored data directly from the counters 416 in the sectors 414. In other embodiments, the controller 114 accesses monitored data from both the counters 416 in the sectors 414 and the counters 408 in the data blocks 402.

The magnification of the block counter 408 illustrates a data structure configured to track erase cycles for a data block 402 according to an embodiment. This data structure may be generated and maintained by the controller 114 via execution of a firmware program. The block counter 408 includes an erase counter 410 and a threshold counter 412. The erase counter 410 is incremented each time the data block 402 is erased. The threshold counter 412 is incremented when the erase counter 410 reaches a predetermined threshold. When the threshold counter is incremented, the controller 114 performs wear leveling on the corresponding data block 402 by remapping corresponding logical addresses to different physical locations in other data blocks 402.

V. Example Applications Involving Multiple Subsystems

Figure 6:
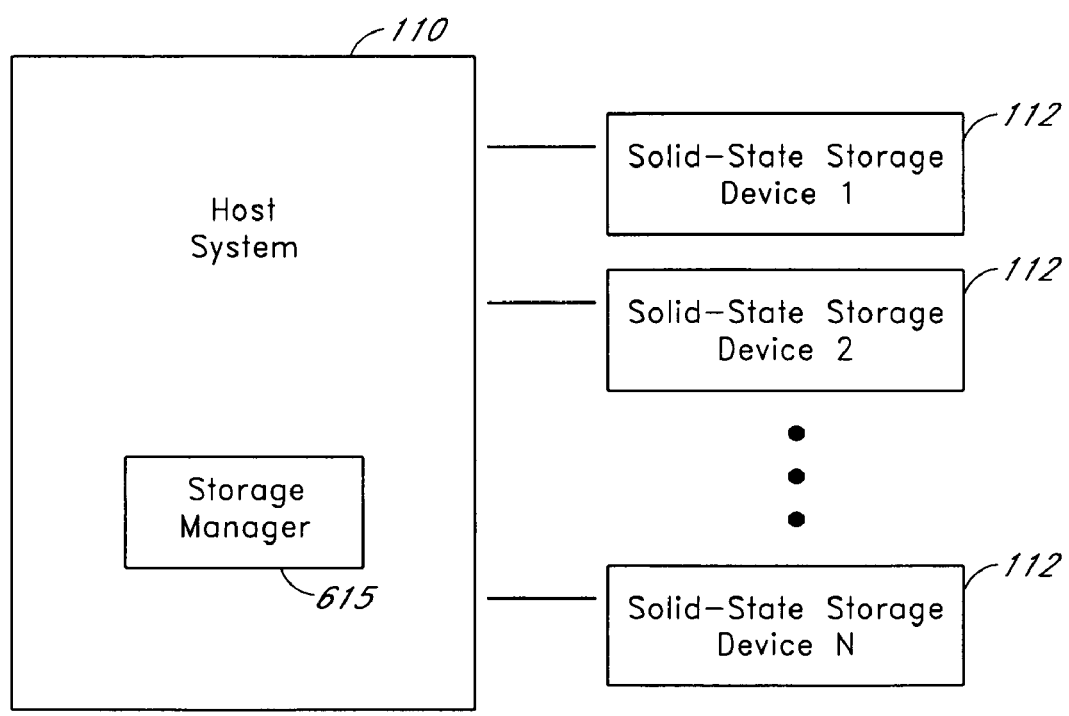
FIG. 6 shows a host system in communication with a plurality of solid-state storage subsystems.

FIG. 6 shows a host system 110 in communication with a plurality of solid-state storage subsystems 112 of the type described above, and will be used to describe some additional applications for the usage statistics information. The host system 110 runs a storage manager program 615, which may include or communicate with a device driver 113 (FIG. 1) as described above. The storage manager reads the raw or processed usage data from each of these subsystems 112, and may use this data in various ways.

For example, the storage manager 615 may use the usage data to perform wear leveling at the device or subsystem level. For instance, where two solid-state storage subsystems 112 are connected to the host system 110, and the first storage subsystem 112 has more wear than the second, the storage manager 615 may choose to direct data storage to the second subsystem so as to reduce wear on the first storage subsystem 112. The storage manager may also attempt, where possible, to store infrequently-changing data to the first storage subsystem, while directing data that changes relatively frequently to the second storage subsystem.

The storage manager 615 may additionally or alternatively differentiate between critical and non-critical data. For example, the storage manager 615 may choose to store less critical data on a device 112 with more wear and to store more critical data on a device 112 with less wear. Application programs that generate or supply such data may notify the storage manager of the data's type (e.g., critical versus non-critical) at the time a write operation is requested. The storage manager 615 may differentiate between critical and non-critical data during every write to the storage subsystems 112, or at other configurable times.

While certain embodiments of the inventions have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A solid state storage subsystem, comprising:
an array of non-volatile solid state memory; and
a controller that provides access to the array of non-volatile solid state memory by executing commands received from a host system;
wherein the controller is operative to store usage statistics reflective of a current wear level of the array of non-volatile solid state memory with one or more associated timestamps in an area of said array that is not accessible via non-vendor-specific commands, and to provide access, via at least one vendor-specific command, to at least one of (1) the usage statistics, including said timestamps, and (2) data values derived by the controller from examining usage statistics obtained from two or more time periods.

2. The solid state storage subsystem of claim 1, wherein the usage statistics maintained by the controller include at least one counter value which indicates a number of program/erase cycles performed.

3. The solid state storage subsystem of claim 1, wherein the usage statistics maintained by the controller include a plurality of counter values, each of which corresponds to a respective memory block and reflects a wear level thereof.

4. The solid state storage subsystem of claim 3, wherein the counter values are stored in the respective memory blocks to which they correspond.

5. The solid state storage subsystem of claim 1, wherein the controller provides host access to at least some of the usage statistics.

6. The solid state storage subsystem of claim 1, wherein the controller outputs information regarding the current wear level, at least in part, by displaying the wear level information on a display that is part of the solid state storage subsystem.

7. The solid state storage subsystem of claim 1, in combination with a program that is configured to use said usage statistics to generate, on the host system, a graphical display depicting an estimate of a remaining life of the solid state storage subsystem.

8. The solid state storage subsystem of claim 1, in combination with a storage manager program that is configured to use said usage statistics to select a type of data to be written to the solid state storage subsystem, wherein the selection comprises selecting critical data to be written to the solid state storage subsystem when said usage statistics indicate less wear and selecting non-critical data to be written to the solid state storage subsystem when said usage statistics indicate more wear.

9. The solid state storage subsystem of claim 1, in combination with a storage manager program that is configured to use said usage statistics to vary a frequency with which data is written to the solid state storage subsystem.

10. The solid state storage subsystem of claim 1, in combination with a driver program configured to use at least one vendor-specific command to retrieve said usage statistics from the solid state storage subsystem.

11. The solid state storage subsystem of claim 1 further comprising program code configured to use said usage statistics to generate a graphical display indicating an estimated remaining useful life of the solid state storage subsystem.

12. The solid state storage subsystem of claim 11, wherein the display is configured as a meter that indicates a utilization of the solid state storage subsystem relative to a percentage scale.

13. The solid state storage subsystem of claim 12, wherein the percentage scale corresponds to a specified endurance of the solid state storage subsystem.

14. The solid state storage subsystem of claim 13, wherein the meter is configured to provide indicia of a threshold relative to the percentage scale.

15. The solid state storage subsystem of claim 14, wherein the threshold is less than the specified endurance of the solid state storage subsystem.

16. The solid state storage subsystem of claim 12, wherein the meter is configured to provide indicia of a time displayed relative to the percentage scale so as to indicate how much of the solid state storage subsystem has been utilized relative to the percentage scale during a predetermined time period.

17. The solid state storage subsystem of claim 11, wherein the display is configured as a bar chart that indicates a utilization of the solid state storage subsystem relative to a percentage scale.

18. The solid state storage subsystem of claim 1, wherein the controller is operative to provide access to the usage statistics, including said timestamps.

19. The solid state storage subsystem of claim 1, wherein the controller is operative to provide access to the data values derived by the controller from examining usage statistics obtained from two or more time periods.

20. A computer-readable medium having stored thereon a computer program which, when executed by a host computer, causes the host computer to use at least one vendor-specific command to retrieve usage information from a solid state storage subsystem that is configured to maintain such usage information in a non-user-data memory area thereof, and to use said usage information to do at least one of the following: (a) generate a graphical display depicting a remaining life of the solid state storage subsystem; (b) select a type of data to be written to the solid state storage subsystem, wherein said usage information is reflective of a number of erase cycles that have been executed by the solid state storage subsystem, wherein the computer program is configured to use said usage information to select a type of data to be written to the solid state storage subsystem, and wherein the selection comprises selecting critical data to be written to the solid state storage subsystem when said usage information indicates less wear and selecting non-critical data to be written to the solid state storage subsystem when said usage information indicates more wear.

21. A computer-readable medium having stored thereon a computer program which, when executed by a host computer, causes the host computer to use at least one vendor-specific command to retrieve usage information from a solid state storage subsystem that is configured to maintain such usage information in a non-user-data memory area thereof, and to use said usage information to do at least one of the following: (a) generate a graphical display depicting a remaining life of the solid state storage subsystem; (b) select a type of data to be written to the solid state storage subsystem, wherein said usage information is reflective of a number of erase cycles that have been executed by the solid state storage subsystem, wherein the usage information comprises a plurality of counter values, and the computer program uses the counter values in combination to generate a data value representing an estimated remaining useful life of the solid state storage subsystem, and wherein said usage information is stored with a timestamp and the data value is generated by examining usage information obtained from two or more time periods.

* * * * *